United States Patent
Pan-Ratzlaff

[19]

[11] Patent Number: 5,835,750
[45] Date of Patent: Nov. 10, 1998

[54] USER TRANSPARENT SYSTEM USING ANY ONE OF A FAMILY OF PROCESSORS IN A SINGLE SOCKET

[75] Inventor: Ruby Y. Pan-Ratzlaff, Austin, Tex.

[73] Assignee: Dell USA, L.P., Round Rock, Tex.

[21] Appl. No.: 744,671

[22] Filed: Nov. 6, 1996

Related U.S. Application Data

[63] Continuation of Ser. No. 538,676, Oct. 2, 1995, abandoned, which is a continuation of Ser. No. 766,877, Sep. 27, 1991, abandoned.

[51] Int. Cl.[6] ................................................ G06F 9/455
[52] U.S. Cl. ............... 395/500; 395/800.34; 395/800.37; 395/830; 395/836; 395/527
[58] Field of Search ..................... 395/820, 520, 395/500, 830, 836, 820.34, 820.37, 527

[56] References Cited

U.S. PATENT DOCUMENTS

| | | | |
|---|---|---|---|
| 4,964,074 | 10/1990 | Suzuki et al. | 364/927.81 |
| 4,972,470 | 11/1990 | Farago | 380/3 |
| 5,109,503 | 4/1992 | Cruickshank et al. | 395/500 |
| 5,134,713 | 7/1992 | Miller et al. | 395/800 |
| 5,321,827 | 6/1994 | Lu et al. | 395/500 |
| 5,546,563 | 8/1996 | Chuang | 395/500 |

*Primary Examiner*—Alyssa H. Bowler
*Assistant Examiner*—John T. Follansbe
*Attorney, Agent, or Firm*—Skjerven, Morrill, MacPherson, Franklin & Friel, L.L.P.; Stephen A. Terrile

[57] ABSTRACT

A digital computer system having a socket capable of accepting any one of a family of processors, the family being defined as those processors having commonality of their respective basic input/output system code. Each processor has assigned pins for conducting specified signals, the pins engaging the socket. There is dissimilarity between at least two of the processors of correspondence where at least one of the specified signals, of one of the processors, is assigned to a different pin from the other processors. When such dissimilarity is present, the signal is redirected to the appropriate designated pin for the particular type of processor.

24 Claims, 5 Drawing Sheets

5,835,750

USER TRANSPARENT SYSTEM USING ANY ONE OF A FAMILY OF PROCESSORS IN A SINGLE SOCKET

This is a Continuation of application Ser. No. 08/538,676, filed Oct. 2, 1995, now abandoned, which is a continuation of application Ser. No. 07/766,877, filed Sep. 27, 1991, now abandoned.

BACK OF THE INVENTION

1. Field of the Invention

This invention deals with a digital computer system having a processor socket capable of accepting any one of a family of processors. More particularly, this invention enables automatically accommodating the various processors in the family.

2. Description of the Related Art

Processors in a family of processors often differ in the assignment of a specified signal to a designated pin. That is, a pin on one of the processors may carry a particular specified signal while the corresponding pin on another of the processors carries a different specified signal.

In the past, it has been common practice to adjust the socket manually for each one of the processors. A jumper wire is placed from one location to another to redirect the particular signal to its assigned pin.

Other prior art solutions to the problem have involved switches that are set to redirect the signal from one pin to another of a particular processor.

Another solution to the problem includes using more than one socket. That is, a socket may be exclusively wired to receive one processor from the family of processors, with a second and third socket wired to accept others of the family. Such a system may include automatically switching those processors in place out of the circuit upon the installation of the last of the processors.

This invention enables the user to simply insert the desired processor from the family of processors into a single socket without concern for installing jumpers or throwing switches. The operation is completely transparent to him.

BRIEF SUMMARY OF THE INVENTION

A digital computer system has a socket capable of accepting any one of a plurality of types of processors having assigned pins for conducting specified signals and for engaging the socket. The processors have a common basic input/output system code and dissimilarity between at least two of the processors of correspondence between at least one of the specified signals and the assigned pins. The Intel Corporation processor types 80486DX, 80486SX and 80487SX, are the processors of the family in this preferred embodiment. Other processors of other families could, of course, be used.

The basic input/output system memory (BIOS) has a program for reading the type of processor, coding the type and storing the code in a register. The BIOS also has a program for detecting the presence or absence of a coprocessor, coding the presence or absence, and storing the code in the register.

A Programmable Array of Logic (PAL) is interposed between the register and the socket. The PAL is connected to certain of the pins and, depending upon the contents stored in the register, reroutes signals to other pins. A gate is used to completely block a signal from entry to the processor, depending upon the contents of the register.

The principle object of this invention is to provide a socket in a computer system that will automatically accept any one of a plurality of types of processors having assigned pins for conducting specified signals and having a common basic input/output system code, irrespective of dissimilarities between specified signals and assigned pins. This and other objects will be made evident in the detailed description that follows.

DETAILED DESCRIPTION OF THE INVENTION

This invention enables a user to interchange any one of a family of processors by simply inserting the processor into a socket. The user does not have to insert any jumpers or throw any switches. Any changes required in the processor socket because of dissimilarity of correspondence between specified signals and assigned pins is completely transparent to the user. The following description details the system used to obtain this result.

Figure 1A:
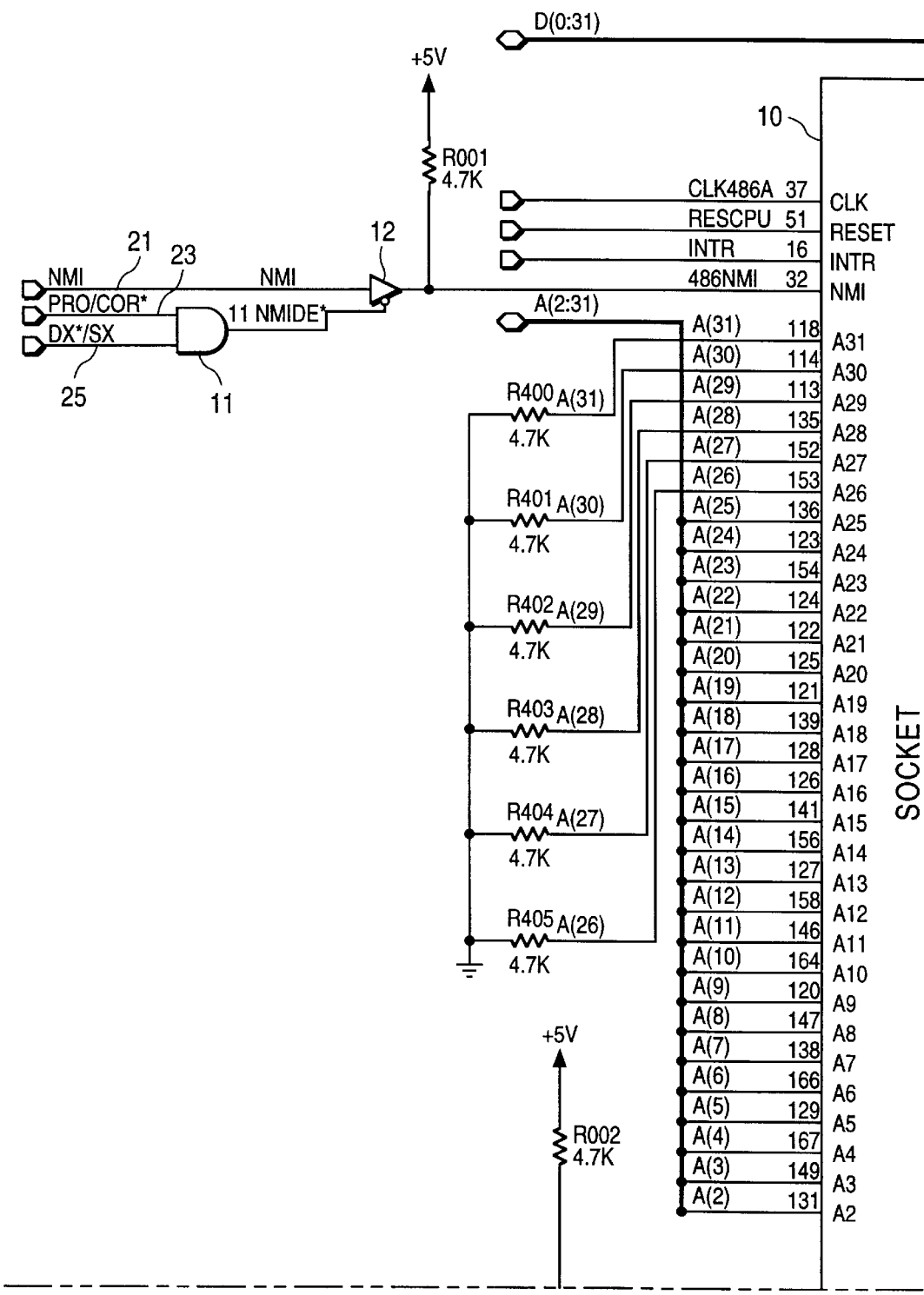
FIG. 1 is a schematic diagram of the socket of this invention.
Figure 1B:
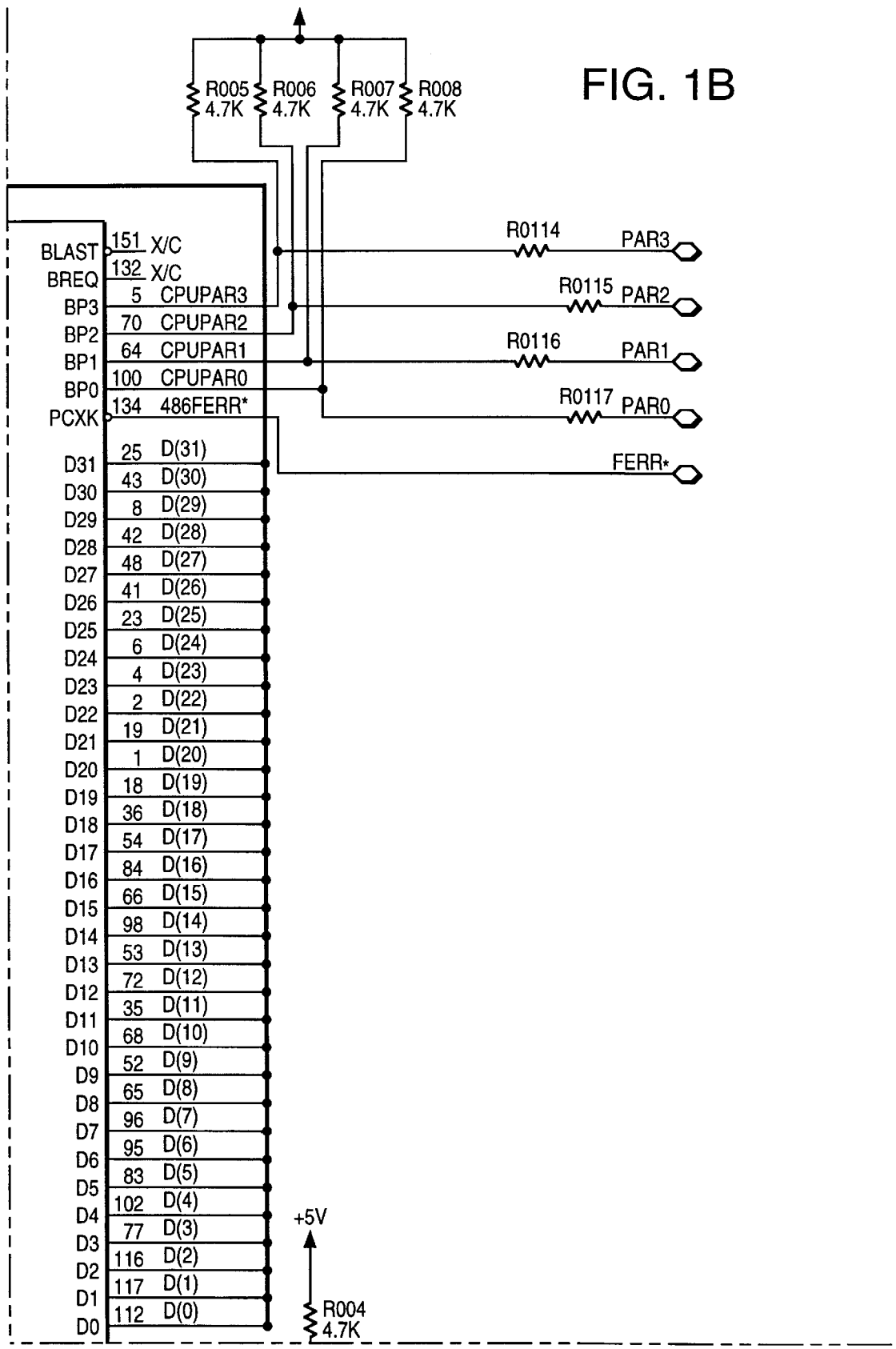
Figure 1C:
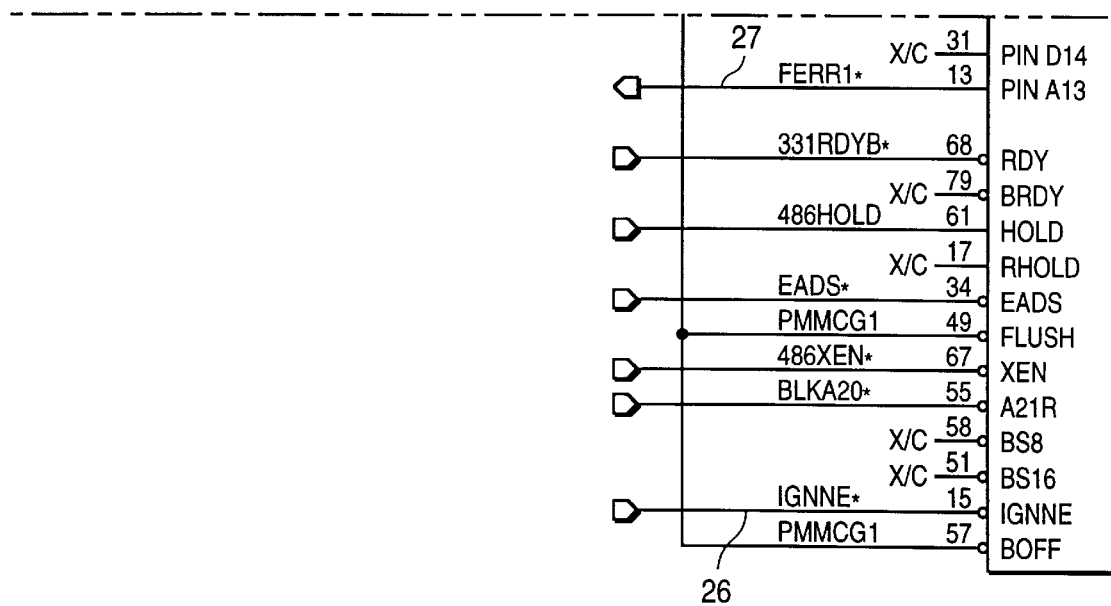
Figures 1, 1D:
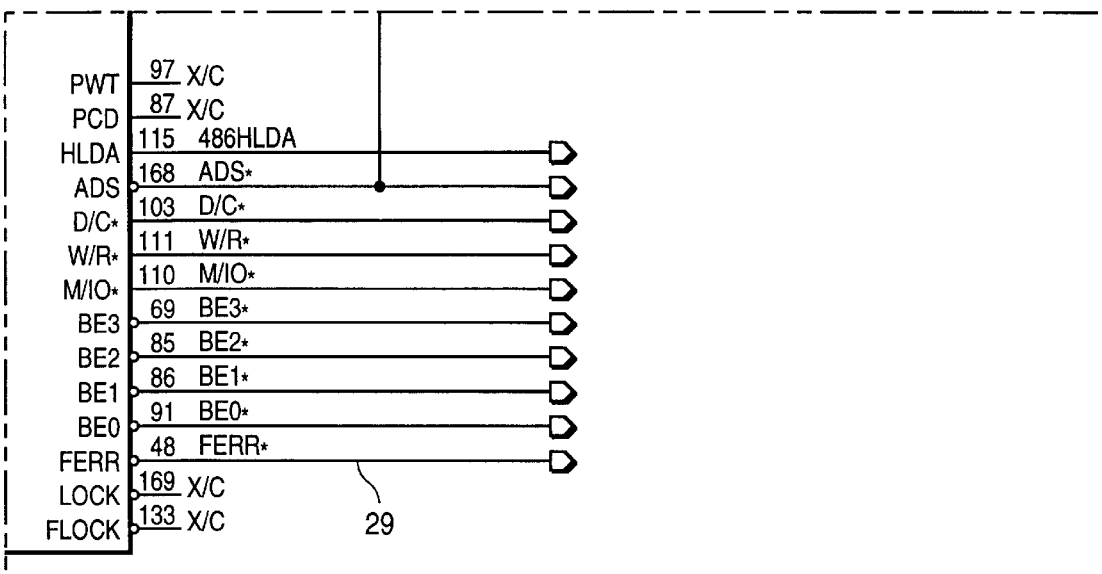

FIGS. 1A, 1B, 1C, and 1D, collectively referred to as FIG. 1, show socket 10 with terminal 26 carrying signal IGNNE*, terminal 27 carrying signal FERR1*, terminal 29 carrying signal FERR*, and terminal 21 carrying signal NMI. Signals PRO/COP* and DX*/SX are combined in AND gate 11 to gate signal NMI through buffer 12. The "*" is used to denote assertion of a low signal level.

Figure 2:
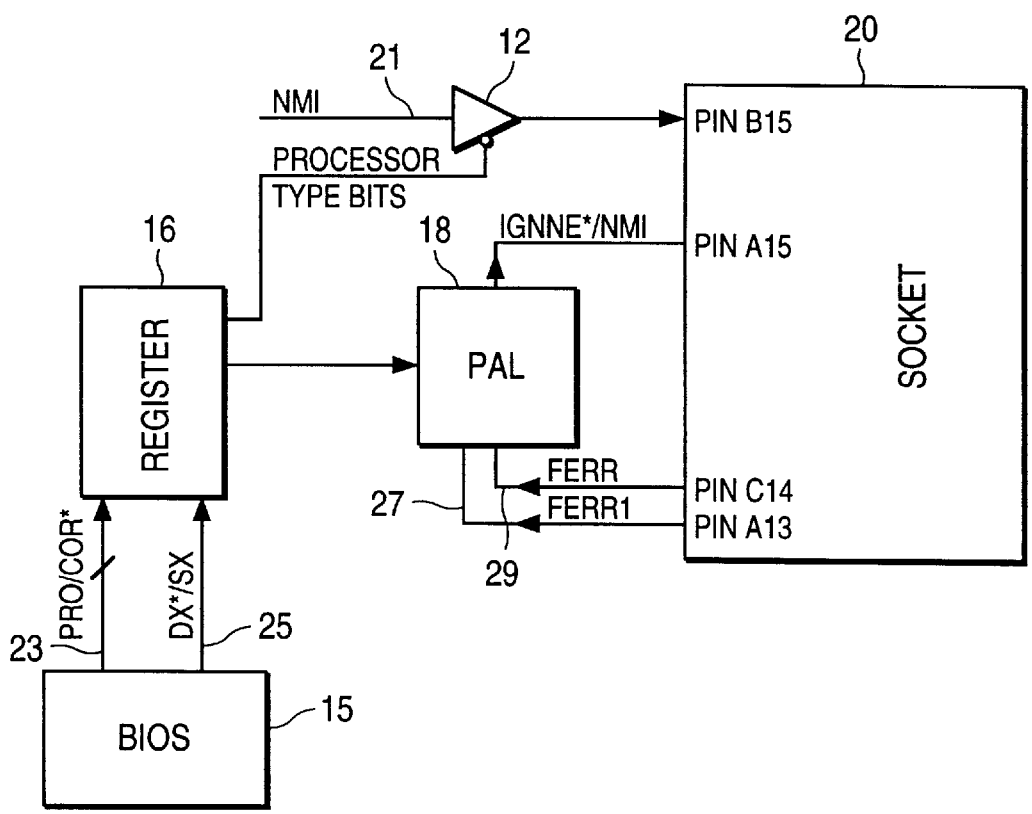
FIG. 2 is a block diagram of the processor, PAL and associated components.

FIG. 2 illustrates socket 10 with the necessary circuitry for enabling the redirection of specified signals to different pins, depending upon the type of processor used.

PAL 18 is shown having output IGNNE*/NMI connected to pin a15 of processor 20. Pins c14 and a13 carries signals FERR* or FERR1*, respectively, to PAL 18. PAL 18, in this preferred embodiment, is a type 16R4–7. PAL 18 redirects signal FERR* (and FERR1*, as designated for the type 80487SX) when required.

In this preferred embodiment, only signals NMI, and IGNNE* are required to be redirected. One of signals FERR* and FERR1* is selected depending upon the type of processor. The following table illustrates the map for these signals.

TABLE 1

Comparative Pin Differences

| Symbol | Pin Numbers | | |
|---|---|---|---|
| | 80486DX | 80486SX | 80487SX |
| FERR* | C14 | NC | A13 |
| IGNNE* | A15 | NC | A15 |
| NMI | B15 | A15 | B15 |
| NC: No Connect | | | |

BIOS 15 of any of the processors includes a program for detecting the processor type when the computer system first powers up. The ID is provided by the processor itself and the program supplied by the BIOS 15 codes that ID into a two bit binary code and stores it in register 16. BIOS 15 also has a program for detecting the presence or absence of a coprocessor, thereby adding to the identification of the processor. This information is coded into one bit in register 16 and is shown as signal PRO/COP*. The ID is shown as signal DX*/SX from BIOS 15 into register 16. Programs written in assembly language source code for determining this identification are listed below.

```
configure_processor_type:
        shld            eax,edx,24                      ;processor rev ID in AH
; DX/SX processor #ype check -
;       if rev ID matches that of 486SX then SX else assume DX
        mov             a1,PORT_XXHIGH_INIT_VAL
        and             ah,11110000b                    ;Mask off minor revision number
        crip            ah,i486SX_REV_ID                ;If CPU rev not same as 486SX/487SX
        je              its_an_sx
        or              al;10000000b                    ;Then set to DX processor
        and             al,not 01000000b
        cmp             ah,i486_P23T_REV_ID
        je              its_P23T_F24                    ;P23T and P24
        mov             ah,al
        jmp             finish_cpu_pin_setup
its_P23T_P24:
        out             PORT_XXHIGH,al
        mov             ah,al                           ;Save PORT_XXHIGH
        out             MATHBSY,al
        fninit
        fldcw           cs:unmasked_error_cw
        fstp            st(0)                           ;Force an FP error
        fnstsw          word ptr cs:(0)
        WAFORIO
        WAFORIO
        mov             al,10b                          ;Read IRR
        out             0a0h,al
        in              al,0a0h
        out             MATHBSY,al                      ;Clear the pending error
        fninit
        fldcw           cs:normal_cw
        test            al,20h                          ;Check furry part
        jnz             finish_cpu_pin_setup            ;If error, P-24 - already done
        or              ah,01000000b
        and             ah,not 10000000b
        jmp             finish_cpu_in_setup
unmasked_error_cw       dw      0340h
normal_cw               dw      037fh
its_an_sx:
        and             ai,00111111b                    ;Else it is SX. Now see if 486 or 487
; Coprocessor presence determination
;       1. Write to a memory location,
;       2. reset FPU,
;       3. store FPU's control word in the same memory location,
;       4. if FPU is present the memory location contents will have
;           changed (to the FPU's control word).
; Note - Since no RAM has been established yet, we use the cache memory
;       under the ROM.
        mov             ebx,cr0
        or              ebx160000000h                   ;Force 466 cache off
        mov             cr01ebx
        invd
try_cpu_guess_again:                                    ;Do not change any code after this label,
                                                        ,unless you truly understand the different
                                                        ,ways we may get here.
        and             a1,not PORT_XX_LOAD_RAM_M       ;Turn on cache program mode
        or              al,20h
        lidt            cs:cpu_guess_tab
        out             PORT_XXHIGH,al
                        ;Address bit 3 - 1 means writable
                        ;Address bit 2 - 1 means not cachable
        mov             bx, 0F000h
        mov             ds, bx
        xor             bx, bx
        mov             cx,1*4                          ;F block, 16K or 32K units (note
                                                        ;that for 32k units cx=2 is enough,
                                                        ;but 4 works for 16k as well as 32k)
        align           16
cache_466_init_loop_coproc:
        mov             dx, dg:[bx]+0100b               ;writable, cachable
        add             bx, 4000h
        dec             cx
        jnz             cache_486_init_loop_coproc
        and             al,not 20h
        out             PORT_XXHIGH,al
        or              al,PORT_XX_LOAD_RAM_M           ;Turn off cache program mode
        out             PORT_XXHIGH,al
        mov             ebx,cr0
        and             ebx,not 60000000h               ;Turn 486 cache on
        mov             cro,ebx
        mov             bx,ds:[0h]                      ,read to get loc 0 into cache
```

```
        mov         word ptr ds:[0],0ffffh          ;write -1 to it
        fninit                                      ,reset FPU
        fnstcw      ds: [0h]                        ,store FPU control word in loc 0
        cmp         word ptr dg:[0],0ffffh
        je          its_Not_A_487                   ;if memory changed (FPU found)
                                                    ,then set pro/cop pin to coprocessor
        or          al,01000000b
        mov         ah,al
        jmp         short finish_cpu_in_setup
its_Not_A_487:                                      ;here set pro/cop pin to processor
        and         al,00111111b
        mov         ah,al
finish_cpu_in_setup:                ;Do not change any code atter this label,
                                    ;unless you truly understand the different
                                    ;ways we may get here.
        lidt        cg:cpu_set_tab
        mov         al,ah
        out         PORT_XXHIGH,al
```

The NMI signal for types 80486DX and 80487SX are applied to pin B15 through buffer 12 by the gating signal from register 16, as shown. If, however, the processor is type 80486SX, then signal NMI is applied to pin A15 via PAL 18, as shown. Signal IGNNE* is applied to pin A15 for types 80486DX and 80487SX and not connected for the type 80486SX. The operation of PAL 18 is described by the following:

```
/** Inputs **/
Pin 1       =   palclk2         ;/* processor clock out of the clock chip   */
Pin 2       =   oscclk2         ;/* copy of the above clock                 */
Pin 3       =   ferr_           ;/* 486DX FERR*                             */
Pin 4       =   ferr1_          ;/* 487SX FERR*                             */
Pin 5       =   pro_cop         ;/* 1 - using a 486SX, 0 - using a 487SX    */
Pin 6       =   dx_sx           ;/* 1 - using a DX, 0 - using an SX         */
Pin 7       =   resnpx          ;/* not used anymore                        */
Pin 8       =   bsy386_         ;/* signal to processor that coproc is busy */
Pin 9       =   !oe_            ;/* testability pin. oe_ = 0 is enabled     */
Pin 11      =   !roe_           ;/* testability pin for registered outputs  */
Pin 12      =   nmi             ;/* NMI from the system                     */
/** Outputs **/
Pin 13      =   errnpx_         ;/* coprocessor error to the 330            */
Pin 14      =   ignne_          ;/*                                         */
Pin 15      =   ferrd_          ;/* ferr* delayed by one clock              */
Pin 16      =   bsynpx_         ;/* coprocessor busy                        */
Pin 17      =   clk2by2         ;/* processor clock divided by 2            */
Pin 18      =   clk2syn         ;/* aligned CLK2                            */
Pin 19      =   !clksyn         ;/* aligned CLK1                            */
/** Logic Equations **/
clk2by2.d   =   !clk2by2 ;
    clksyn      = ! oscclk2 & clk2by2           /* Take skew out of clk2 and clk1 by */
                # clksyn & clk2by2              /* making sure both clocks are generate
                # clksyn & oscclk2 ;            /* off of the same edge */
    clk2syn     = !oscclk2 ;
    errnpx_     = bsynpx_;
    $define     s0  b'111
    $define     s1  b'001
    $define     s2  b'011
    $define     s3  b'010
    $define     s4  b'110
    $define     s5  b'000
    $define     s6  b'100
    $define     s7  b'101
    FIELD       npxerr = [ferrd_, bsynpx_, ignne_];
    SEQUENCE    npxerr {
    present     s0
        if !nmi & pro_cop & !dx_sx next s4 ;    /* 486SX nmi steering */
        if !ferr_ & dx_sx next s1 ;
        if !ferr1_ & !dx_sx & !pro_cop next s1 ;
        default next s0 ;
    present     s1
        if ferr_ & dx_sx next s0 ;              /* return if error went away */
        if ferr1_ & !dx_sx & !pro_cop next s0 ;
        if pro_cop & !dx_sx next s4 ;           /* if 486SX, route to S4 */
        default next s2 ;
    present     s2
        if bsy386_ next s3 ;    /* goes not busy when portF0 written to
        if ferr_ & dx_sx next s0 ;
        if ferr1_ & !dx sx & !pro_cop next s0 ;
```

```
        if pro_cop & !dx_sx next s4 ;
        default next s2 ;
    present         s3
        if ferr_ & dx_sx next s0 ;
        if ferr1_ & !dx_sx & !pro_cop next s0 ;
        if pro_cop & !dx_sx next s4 ;
        default next s3 ;
    present         s4
        if nmi & pro_cop & !dx_sx next s0 ;     /* wait for 486SX nmi */
        if dx_sx next s0 ;
        if !dx_sx & !pro_cop next s0 ;
        default next s4 ;
    present         s5
        next s0 ;
    present         s6
        next s0 ;
    present         s7
            next s0 ;
    }
    clksyn.oe    =   oe_ ;
    clk2syn.oe   =   oe_ ;
    errnpx_.oe   =   oe_ ];
```

MODE OF OPERATION

Assume that a type 80486SX processor is installed in the socket 10. In that case, signal NMI is blocked by gate 12 from pin B15 of socket 10. Signal NMI is redirected through PAL 18 to pin A15, the correct pin as indicated in table 1. That is the only redirection required in that instance. When a type 80487SX processor is installed, the NMI signal is gated through buffer 12 to pin B15 of socket 10. Signal IGNNE* is gated by the PAL to pin A15. Pin A13 is scanned for its indication of signal FERRI*.

When a type 80486DX processor is installed, signal NMI is gated through buffer 12 and impressed on pin B15. Signal IGNNE* is gated by the PAL to Pin A15. Pin C14 is scanned for its indication of signal FERR*. In this manner, it is shown that at least three different processors from the same family may each be installed in a single socket without the user having to take any further steps or precautions.

The above-described arrangement is merely an illustrative application of the principles of the invention; numerous other arrangements may be devised by those skilled in the art without departing from the skill and scope of the invention which is limited only as defined by the appended claims.

What is claimed is:

1. A digital computer system comprising:
   a processor socket capable of accepting any one of a plurality of types of processors wherein all processor types have assigned pins for conducting specified signals and for engaging the processor socket, a common basic input/output system identification code, and dissimilarity of correspondence between at least one of the specified signals and assigned pins;
   a memory, storing a basic input/output system program for detecting the type of processor by use of the common basic input/output system identification code and for providing an identification signal indicative of the processor type;
   logic circuitry, connected to the processor socket, for selectively redirecting the at least one of the specified signals to another assigned pin of the processor, as determined by the identification signal;
   a register for storing the identification signal, the logic circuitry being responsive to the identification signal stored in the register when selectively redirecting the at least one of the specified signals to another assigned pin of the processor.

2. The system of claim 1 where the logic circuitry includes a Programmable Array of Logic (PAL), connected to the processor socket, for the selectively redirecting the at least one of the specified signals to another assigned pin of the processor.

3. The system of claim 1 where the logic circuitry includes a gate with an output connected to the processor socket, the gate selectively blocking a specified signal to an assigned pin of the processor, as determined by the identification signal.

4. The system of claim 3 where a Non-maskable Interrupt (NMI) signal is blocked from a B15 pin when an 80486SX processor is detected in the processor socket.

5. The system of claim 3 where a Non-maskable Interrupt (NMI) signal is redirected to a pin B15 when a 80487SX processor is detected in the processor socket.

6. The system of claim 3 where a Non-maskable Interrupt (NMI) signal is redirected to a pin B15 when a 80486DX processor is detected in the processor socket.

7. The system of claim 1 where a Non-maskable Interrupt (NMI) signal is redirected to a pin A15 when a 80486SX processor is detected in the processor socket.

8. The system of claim 1 where an Ignore Numeric Error* (IGNNE*) signal is redirected by the logic circuitry to a pin A15 when a 80487SX processor is detected in the processor socket.

9. The system of claim 1 where an Ignore Numeric Error* (IGNNE*) signal is redirected by the logic circuitry to a pin A15 when a 80486DX processor is detected in the processor socket.

10. The system of claim 1 where an Ignore Numeric Error* (IGNNE*) signal is blocked by the logic circuitry when a 80486SX processor is detected in the processor socket.

11. The system of claim 1 where the Floating Point Error* (FERR*) signal is redirected from a pin C14 by the logic circuitry when a 80486DX processor is detected in the processor socket.

12. The system of claim 1 where the Floating Point Error 1 (FERRI*) signal is redirected from a pin A13 by the logic circuitry when a 80487SX processor is detected in the processor socket.

13. The system of claim 1 where the memory further includes a basic input/output system program for detecting the presence or absence of a coprocessor and for providing a coprocessor detection signal indicative of whether a coprocessor is present or absent.

14. A digital computer system comprising:
a processor socket capable of accepting any one of a plurality of types of processors wherein all processor types have assigned pins for conducting specified signals and for engaging the processor socket, a common basic input/output system identification code, and dissimilarity of correspondence between at least one of the specified signals and assigned pins;
a memory, storing a basic input/output system program for detecting the type of processor by use of the common basic input/output system identification code and for providing an identification signal indicative of the processor type, the memory storing a basic input/output system program for detecting the presence or absence of a coprocessor and for providing a coprocessor detection signal indicative of whether a coprocessor is present or absent:
logic circuitry, connected to the processor socket, for selectively redirecting the at least one of the specified signals to another assigned pin of the processor, as determined by the identification signal;
a register for storing the identification signal and the coprocessor detection signal, where the logic circuitry is responsive to the identification signal and the coprocessor detection signal stored in the register in selectively redirecting the at least one of the specified signals to another assigned pin of the processor.

15. The system of claim 14 where the logic circuitry includes a gate with an output connected to the processor socket, the gate selectively blocking a specified signal to an assigned pin of the processor, as determined by the identification signal and the coprocessor detection signal.

16. The system of claim 15 where a Non-maskable Interrupt (NMI) signal is redirected to a pin B15 when a 80487SX processor is detected in the processor socket.

17. The system of claim 15 where a Non-maskable Interrupt (NMI) signal is blocked from a pin B15 when an 80486SX processor is detected in the processor socket.

18. The system of claim 15 where a Non-maskable Interrupt (NMI) signal is redirected to a pin B15 when a 80486DX processor is detected in the processor socket.

19. The system of claim 14 where a Non-maskable Interrupt (NMI) signal is redirected to a pin A15 when a 80486SX processor is detected in the processor socket.

20. The system of claim 14 where an Ignore Numeric Error* (IGNNE*) signal is redirected by the logic circuitry to a pin A15 when a 80487SX processor is detected in the processor socket.

21. The system of claim 14 where an Ignore Numeric Error* (IGNNE*) signal is blocked by the logic circuitry when a 80486SX processor is detected in the processor socket.

22. The system of claim 14 where an Ignore Numeric Error* (IGNNE*) signal is redirected by the logic circuitry to a pin A15 when a 80486DX processor is detected in the processor socket.

23. The system of claim 14 where the Floating Point Error 1* (FERR1*) signal is redirected from a pin A13 by the logic circuitry when a 80487SX processor is detected in the processor socket.

24. The system of claim 14 where the Floating Point Error* (FERR*) signal is redirected from a pin C14 by the logic circuitry when a 80486DX processor is detected in the processor socket.

* * * * *

UNITED STATES PATENT AND TRADEMARK OFFICE
CERTIFICATE OF CORRECTION

PATENT NO.    : 5,835,750
ISSUE DATE    : November 10, 1998
INVENTOR      : Pan-Ratzloff, Ruby Y.

It is certified that error appears in the above-identified patent and that said Letters Patent is hereby corrected as shown below:

On Cover Sheet under "United States Patent" [19], please delete "Pan-Ratzlaff" and insert --Pan-Ratzloff--.

Please correct the cover page of the above-identified U.S. Letters Patent in Section 75 to read:
    [75]    Inventor:    Ruby Y. Pan-Ratzloff, Austin, Tex.

Signed and Sealed this

Eighth Day of May, 2001

*Attest:*

NICHOLAS P. GODICI

*Attesting Officer*    *Acting Director of the United States Patent and Trademark Office*